(12) United States Patent
Smith et al.

(10) Patent No.: US 6,696,856 B1
(45) Date of Patent: Feb. 24, 2004

(54) FUNCTION BLOCK ARCHITECTURE WITH VARIABLE DRIVE STRENGTHS

(75) Inventors: Lyle Smith, Menlo Park, CA (US); Eric Dellinger, San Jose, CA (US); Eric West, San Jose, CA (US); Shridhar Mukund, San Jose, CA (US)

(73) Assignee: Lightspeed Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/020,469

(22) Filed: Oct. 30, 2001

(51) Int. Cl.[7] .......................... G06F 7/38; H03K 19/177
(52) U.S. Cl. .............................. 326/39; 326/38; 326/41
(58) Field of Search .............................. 326/37, 38, 39, 326/40, 41, 47

(56) References Cited

U.S. PATENT DOCUMENTS

| | | | |
|---|---|---|---|
| 4,441,075 A | 4/1984 | McMahon | 324/73 |
| 4,556,840 A | 12/1985 | Russell | 324/73 |
| 4,706,216 A | 11/1987 | Carter | 365/94 |
| 4,786,904 A | 11/1988 | Graham, III | 340/825.83 |
| 4,975,601 A | 12/1990 | Steele | 326/38 |
| 5,128,559 A | 7/1992 | Steele | 326/38 |
| 5,206,184 A | 4/1993 | Allen | 437/51 |
| 5,341,041 A | 8/1994 | El Gamal | 307/446 |
| 5,365,125 A | 11/1994 | Goetting | 326/39 |
| 5,386,154 A | 1/1995 | Goetting | 326/38 |
| 5,416,784 A | 5/1995 | Johnson | 371/22.5 |
| 5,451,887 A | 9/1995 | El-Avat | 326/39 |
| 5,477,165 A | 12/1995 | ElAyat | 326/38 |
| 5,488,316 A | 1/1996 | Freeman | 326/41 |
| 5,488,318 A | 1/1996 | Vajapey | 326/48 |
| 5,489,858 A | * 2/1996 | Pierce et al. | 326/56 |
| 5,500,608 A | 3/1996 | Goetting | 326/39 |
| 5,513,190 A | 4/1996 | Johnson | 371/22.5 |
| 5,533,032 A | 7/1996 | Johnson | 371/22.5 |
| 5,570,041 A | 10/1996 | El-Avat | 326/41 |
| 5,958,026 A | * 9/1999 | Goetting et al. | 710/52 |
| 6,014,038 A | 1/2000 | How | 326/46 |
| 6,223,313 B1 | 4/2001 | How | 714/724 |
| 6,331,790 B1 | * 12/2001 | Or-Bach et al. | 326/41 |

OTHER PUBLICATIONS

U.S. patent application Ser. No. 09/414,697, How, filed Oct. 7, 1999.
Chip Express® Powerpoint Presentation, as downloaded from www.chipexpress.com on Sep. 10, 1996, pp. 1–18.
Zilinx® The Programmable Logic Data Book, Sep. 1996, pp. 13–14, 4–294–4–295, 4–11–4–17.
Brown, et al. "FPGA and CPLD Architectures: A Tutorial," IEEE Design & Test of Computers, vol. 13, No. 2, Jun. 1, 1996, pp. 42–57.
Bursky, "Efficient RAM–Based FPGA's Ease System Design," Electronic Design, Jan. 22, 1996, No. 2., pp. 53,54,58,60,62.

* cited by examiner

*Primary Examiner*—Daniel Chang
(74) *Attorney, Agent, or Firm*—Sarah Barone Schwartz; Quirk & Tratos (57) ABSTRACT

Described herein is an ASIC having an array of predesigned function blocks. The function blocks can be used to implement combinational logic, sequential logic, or a combination of both. The function blocks also have a selectable output drive strength. The output drive strength can be selected, in some embodiments, using mask programming.

18 Claims, 5 Drawing Sheets

FUNCTION BLOCK ARCHITECTURE WITH VARIABLE DRIVE STRENGTHS

FIELD OF INVENTION

The present invention generally relates to integrated circuits, and more specifically, to a function block architecture for application specific integrated circuits (ASICs).

BACKGROUND OF THE INVENTION

Use of ASICs (application specific integrated circuits) has become widespread in the semiconductor industry as giving circuit design engineers a relatively high amount of functionality in a relatively small package. In particular, ASICs are customizable integrated circuits that are customized to implement a circuit specified by a design engineer (a "user-defined circuit"). The term "ASIC" actually refers to a variety of integrated circuit (IC) styles that vary in degree of customizability, including standard cells, module based arrays, and gate arrays. As a general rule, the more customization that is required, the more expensive the ASIC will be and the longer the ASIC will take to fabricate and/or customize.

ASICs, such as gate arrays and module based arrays, generally include an array of function blocks, where each function block is predesigned and/or prefabricated to include a particular number, arrangement, and type of semiconductor devices, e.g., transistors. To customize the ASIC to implement a particular user-defined circuit, various connections are made among the semiconductor devices within the function block and/or various connections are made among function blocks (i.e., although the semiconductor devices are fixed in size and position, routing is customized).

Figure 1:
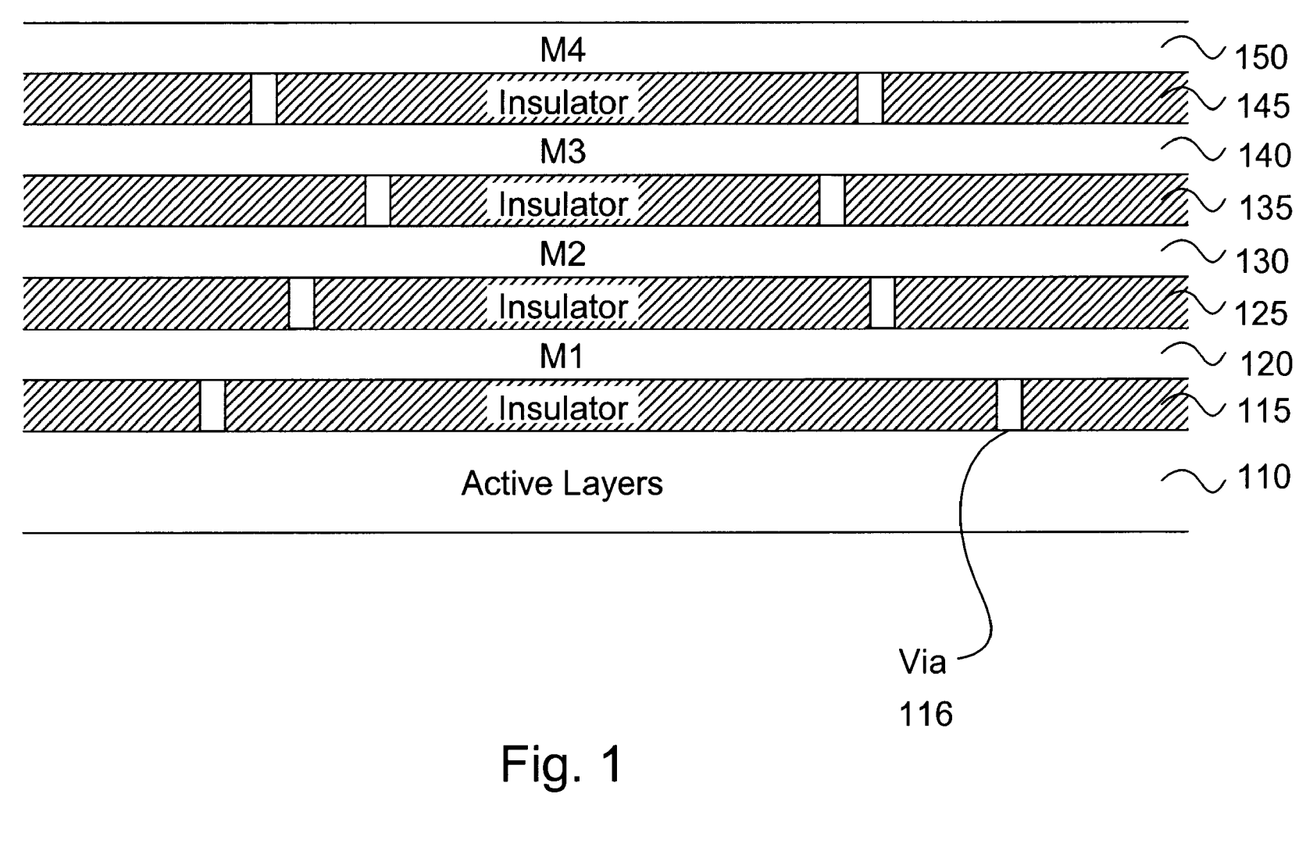
FIG. 1 is a generalized cross-section of a typical integrated circuit.

In forming ASICs generally, several layers will be required. FIG. 1 shows a cross-sectional view of a generic integrated circuit. First, active layers are formed on a semiconductor substrate. The active layers 110 include devices such as transistors and diodes. Most active layer devices are formed independently of one another, i.e., they are not connected to form a circuit. Thus, once active layers 110 are formed, conducting layers, which are often composed of a metal such as aluminum or copper but can be formed with other conductors, are formed over the active layers to interconnect the devices, thereby forming a circuit. Several conducting layers may be required to completely interconnect the devices to form a useful circuit. Four metal layers, M1 120, M2 130, M3 140, and M4 150, are shown in FIG. 1. Of course, different types of ICs may require more or less than four metal layers for circuit interconnection.

In between each conducting layer is an insulating layer 115, 125, 135, 145 as shown in FIG. 1. Insulating layers are present to prevent shorts between conducting layers. To interconnect the conducting layers, vias 116 are formed through the insulating layers.

In forming the structure of FIG. 1, after the active layers 110 are formed, an insulating layer 115 is formed over the active layers 110, for instance, by growth or deposition of insulating material. Next, a masking step is utilized to form vias in the insulating layer, as is generally known in the art. Such masking often entails depositing a photoresist layer and patterning the layer using ultra-violet light, enabling removal of only selected portions of the photoresist, and then etching the insulating layer in accordance with the photoresist pattern. After forming the vias, a conducting layer is deposited and then patterned using a similar masking process, so that metal (or other conductor) remains only in desired locations. The process is repeated for each insulating layer and conducting layer required to be formed.

Thus each conducting layer required to be formed generally demands at least two masking steps: one step to form vias through the insulating layer to connect to the layer below and one step to form connection wires or lines. Unfortunately, each mask step required generally entails significant time and expense.

At the active layer level, ASIC active devices are generally arranged to form an array of function blocks, also commonly referred to as cells or modules. To interconnect active devices within each function block (i.e., form "local interconnections") a series of horizontal and vertical connection lines formed in the conducting layers are utilized. As is well understood in the art, any two points can be connected using a series of horizontal and vertical connection lines. While such local interconnections can be done in one metal layer, more typically, horizontal connections are formed in a first metal layer and vertical connections are formed in a second metal layer with an insulating layer having vias formed between.

Of great importance to an IC designer in implementing circuit designs with an ASIC is the functionality available from the ASIC. That is, the IC designer may have circuit designs which include a large number of different combinational functions (e.g., Boolean logic), sequential functions (e.g., flip-flops, latches), and/or memory functions (e.g., SRAM), and the designer would prefer an ASIC which efficiently implements a significant majority of his or her design so that the overall design is implemented in the smallest space possible. Since ASICs are generally formed of an array of function blocks, the functionality available in each of these devices will be primarily determined by the architecture within each function block or module.

Also important to an IC designer is customization time. Particularly during the design stages, the IC designer wants to obtain a model, or prototype, of his or her designs quickly so that the designs can be tested and used with other circuitry.

One approach to gate arrays is to create a function block with primarily freestanding transistors, that is, transistors that have few, if any, internal connections to one another within the function block, sometimes referred to as a "sea of gates." The transistors within such a function block often vary in size and drive capability with respect to one another to aid in achieving various functions.

In order to customize a sea-of-gates type architecture, routing of connections between the transistors within the function block as well as those formed between function blocks must be undertaken to implement a user-defined circuit. There are generally three to five layers of connecting wires formed over the transistor layer, and each layer requires at least two masking steps to form (one step to form vias to the layer below and one step to form connecting wires). Thus, six to ten masking steps must be undertaken to fully customize a sea-of-gates type gate array. So although this approach allows for circuit flexibility by allowing for implementation of combinational and sequential functions, as well as memory functions, such an approach will bear additional costs due to multiple masking and routing steps. In addition, because of the multiple masking steps required, production time for customizing the gate array can be considerable.

A second approach to gate arrays, and one having a more rapid customization time, is field programmable gate arrays (FPGAs). The function block configuration in an FPGA is often composed of a fixed circuit of multiplexers and other logic gates and is usually arranged such that varying the input signals to the function block will form various useful functions. Thus, to customize an FPGA, an IC designer can specify signals to be coupled to the inputs and outputs for each function block.

FPGA customization time tends to be more rapid than other types of gate arrays because the transistor layer and all connection layers (all vias and wires) are fixed. Also fixed and in between the function blocks in the array is an interconnect structure formed of a plurality of intersecting wires. At each intersection is either a fuse or a programmable RAM bit. Thus, to program function-block functionality (i.e., to control input signals to each function block), either a fuse is stressed to melt and form a connection at the intersection, or a RAM bit is programmed to form this connection. Since the entire FPGA structure is fixed by the manufacturer, no additional mask steps are required and FPGA programming can actually be done by the IC designer with equipment and software at his or her own place of business. Commonly, an IC designer will specify a function (often from a library) that the designer wishes the function block to perform and the signals to be coupled to function block inputs and outputs are then determined and programmed by software.

Despite rapid and easy customization, FPGAs currently available have drawbacks. First, FPGAs are often used in intermediate design steps for test purposes, but cannot often be used in a final product: because of the nature of the FPGA interconnect structure, an FPGA often will not meet the performance expectations of the final product (e.g., timing) and thus has only limited use in test situations.

Second, few, if any, FPGA manufacturers have developed a function block architecture which can fully support the functionality (e.g., combinational, sequential, and memory functions) required by an IC designer. Almost all FPGA producers produce function blocks capable of implementing a variety of combinational circuits (e.g., Boolean functions). A few FPGA suppliers in addition to providing circuits capable of combinational logic, will also provide distinct function blocks for sequential logic (e.g., flip-flops, latches) spaced periodically throughout the FPGA array. While providing the designer with periodic function blocks for sequential function support is helpful, these sequential function blocks may not be in an ideal location with respect to other function blocks (e.g., those supporting combinational functions), may not occur often enough to adequately support IC designs, and particularly may be less than ideal with respect to routing, timing, and other placement issues. Moreover, a user will typically not be able to select the output drive strength of a particular function block, which may cause loading problems in certain circumstances.

Other FPGA providers provide function blocks which can support both combinational and sequential functions. However, these function blocks are usually designed so that the circuitry supporting each of these function types is separate and distinct within the function block. While providing more options to the designer, this approach will significantly limit gate arrays in size since each function block takes up considerably more space in accommodating distinct circuitry to support each function type.

As IC designers create more and more complex IC designs, they are demanding more functional capabilities from gate arrays while further demanding that customization time remain low, that gate array die size remain small, and that device reliability remain high. So, although available gate arrays allow some flexibility to the IC designer, improved architectures are always desirable. Particularly desirable is any architectural design that allows increased flexibility and functionality while reducing customization time.

SUMMARY OF THE INVENTION

The present disclosure describes an ASIC having an array of predesigned function blocks that can implement a user-defined circuit, that will allow any function block to be used for combinational and/or sequential logic, and that provides the function blocks with selectable output drive strength.

In particular, one embodiment of the invention has function blocks that include a logic block and a driver block. The logic block includes a plurality of disconnected gate clusters. The gate clusters can implement a wide variety of logic, including either sequential or combinational logic, simply by selecting the inputs to the respective gate clusters through customized routing. In addition, in one embodiment, the logic block includes a driver group that includes a plurality of drivers. The driver group can be programmed to produce a selected output drive strength. Such programming is mask programming (e.g., customized routing) in one embodiment.

In addition, the function blocks also include a driver block. In one embodiment the driver block also includes a driver group, including a second plurality of drivers, that can be programmed to produce a second selected output drive strength.

In some embodiments, each function block includes a ratio of logic blocks to driver blocks, for instance 4:1 or 2:1.

An embodiment in accordance with the invention will provide tremendous flexibility to the ASIC user including flexibility in that each function block can be used for combinational logic, sequential logic, or a combination of both, as well as flexibility in selecting output drive strength. Further, because an embodiment of the invention is a module based array that is largely predesigned, customization (mask programming) can be done rapidly.

BRIEF DESCRIPTION OF THE DRAWINGS

The present invention is described with respect to particular exemplary embodiments thereof and reference is accordingly made to the drawings in which.

DETAILED DESCRIPTION

Figure 2:
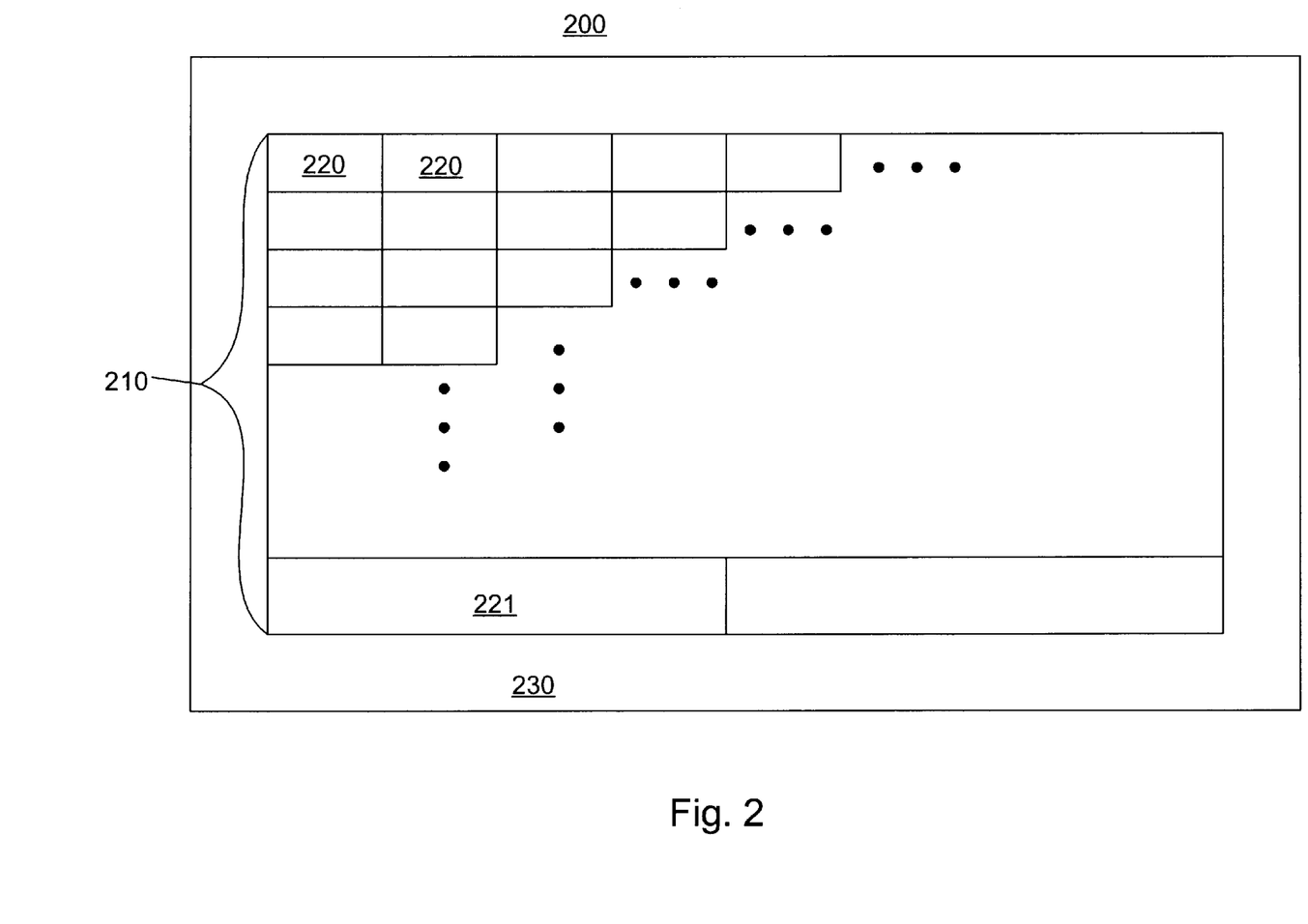
FIG. 2 is a generalized block diagram of an ASIC in accordance with an embodiment of the invention.

A generalized block diagram of an ASIC 200 in accordance with the invention is shown in FIG. 2. ASIC 200 includes an array 210 of function blocks 220. In one embodiment of the invention, each function block 220 is identical to the other function blocks in array 210, although other embodiments of the invention allow for variance among function blocks. Some embodiments may include one or more regions 221, which contain circuitry such as memory blocks or logic cores. Also shown in FIG. 2 is periphery area 230 surrounding array 210. Periphery area 230 includes circuitry such as IO pads, test support circuitry, and other support circuitry for array 210.

Each function block has a predesigned internal architecture, including a predesigned arrangement and coupling of semiconductor devices, inputs, and outputs, but the function performed by each function block can be varied by varying input signals to each respective function block. Input signals may be varied by coupling an input to a logical high signal, a logical low signal, the output of the same or different function block, or a signal from off-chip. Such coupling will occur when the circuit is customized by routing (e.g., placing one or more customized conducting layers over the fixed array structure). Such an array 210 is sometimes referred to as a "module based array" or "MBA."

Figure 3:
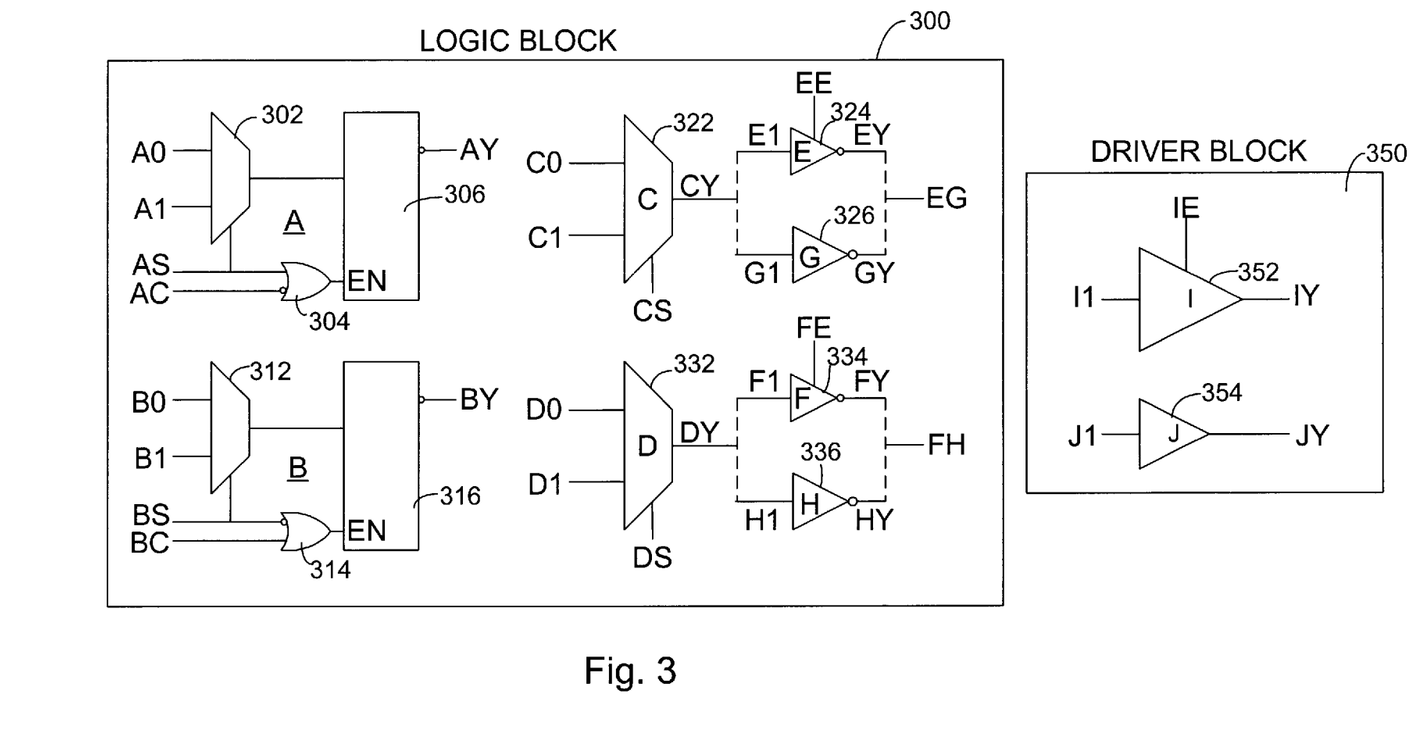
FIG. 3 is a functional schematic of a function block, including a logic block and a driver block, in accordance with an embodiment of the invention.

As shown in FIG. 3 each function block 220 in an array in accordance with an embodiment of the invention is predesigned through several conducting layers and includes at least one logic block 300 and at least one driver block 350. Each logic block 300 in one embodiment includes a plurality of disconnected gate clusters, e.g., clusters A–H shown in FIG. 3. The gate clusters are formed in the device layer of an embodiment of the invention along with one or more conducting layers to form interconnections among devices such as transistors to achieve the logic shown.

Cluster A includes a multiplexer 302, an OR gate 304, and an inverting latch 306 with enable. Multiplexer 302 receives as inputs A0, A1, and select input AS. OR gate 304 receives as inputs AS and AC. Note that OR gate 304 has one input, AC, that is active low. The output of OR gate 304 is coupled to the enable input of latch 306. The output from mux 302 is coupled to the data input of latch 306. Latch 306 produces as an output AY. As will be understood by those of skill in the art, latch 306 can be implemented with a pair of cross-coupled inverters. Mux 302 and OR gate 304—along with other logic gates depicted—are implemented with transistors as is well understood in the art. Cluster A can implement an inverting master latch or an inverting multiplexer, depending on how AC and AS are programmed.

Cluster B is similar to cluster A, including a multiplexer 312, an OR gate 314, and a latch 316. Multiplexer 312 receives as inputs B0, B1, and select input BS. OR gate 314 receives as inputs BS to its active low input and BC to its active high input. The output of OR gate 314 is coupled to the enable input of latch 316. The output from mux 312 is coupled to the data input of latch 316. Latch 316 produces an output BY. The only distinction between cluster A and cluster B is that the inverting input on OR gate 314 in cluster B is flipped from that in cluster A.

Cluster C and D each include an unbuffered mux 322 and 332, respectively, in one embodiment. The inputs to mux 322 include C0, C1, and select line CS, and mux 322 has an output CY. The inputs to mux 332 include D0, D1, and select input DS, and mux 332 has output DY. In many embodiments, the outputs of each of these multiplexers 322 and 332 will often be connected upon customized routing to the inputs of one or both drivers in the driver pairs E/G or F/H, respectively, discussed below. Still, in some customized uses of the present embodiment, they will not be so coupled.

Clusters E and G each include a respective inverter 324, 326. Inverter 324 has an input E1 and an output EY. In addition, inverter 324 has a tri-state enable EE. Inverter 326 has an input G1 and an output GY. Inverter 326 does not include a tri-state enable input. However, the drive strength of inverter 326 is greater than that of inverter 324, and in one embodiment is twice that of inverter 324. Hence, if the drive strength of inverter 324 is d then that for inverter 326 is 2d. In one embodiment, drive strength d is selected to be optimal for small nets of approximately 10–15 unit loads and will be inversely proportional to driver resistance.

In some embodiments, when the ASIC is prefabricated and prior to customization, to implement a user-defined circuit, inverter 324 and inverter 326 are uncoupled to any other device. However, as shown by the dashed lines in FIG. 3, during customization, inputs E1 and G1 can easily be coupled together as can outputs EY and GY forming output EG to have a drive strength 3d (d+2d). Thus, the drive strength in the E/G pair is essentially programmable. For instance, output CY can be coupled simply to input E1 for drive strength of d. Output CY could easily be coupled to input G1 for an output drive strength of 2d. Alternatively, output CY could be coupled to both E1 and G1 for an output drive strength of 3d on EG.

The gate cluster pair F and H work in a similar manner to the cluster pair E and G, having the same programmable drive strengths d, 2d, or 3d, and can easily be coupled to output DY from cluster D. It should be understood that although pairs of drivers are described for the E/G and F/H pairs more than two drivers could be utilized to provide more output drive strength options.

Because the cluster pairs E/G and F/H will often be used with the mux clusters C and D, respectively, in some embodiments, it may be useful to think of clusters C, E and G as a single cluster rather than three individual gate clusters as well as thinking of clusters D, F, and H as a single cluster rather than three individual clusters.

To customize an array that includes logic blocks 300, in one embodiment, after a description of a user-defined circuit is received from a user (such as an IC designer), one or more conducting layers are lain over the predesigned array structure. The conducting layers enable the inputs and outputs of the gate clusters to be coupled to one another, coupled to power or ground, or coupled to gate clusters (or driver groups) in other logic blocks or other function blocks. Customization using one or more customized conducting layers is sometimes referred to herein as "mask programming."

By selectively coupling the inputs and outputs of the gate clusters (and, therefore, of the logic blocks), circuits can be formed to perform various functions. For instance, the gate clusters A and B can be used as two independent latches or to form a master-slave flip-flop. To form a master-slave flip-flop, AC and BC are coupled to a clock signal. AS, A1, and B0 are coupled to a logical low (e.g., "0" or gnd) while BS is coupled to a logical high signal ("1" or Vdd). AY is coupled to B1. A0 serves as the data input to the flip-flop while BY serves as the flip-flop output ("Q").

In addition, it is recommended in most embodiments that any signal leaving a logic block 300 be buffered with one of the gate clusters E–H. Accordingly, since in the above example the output BY is not buffered, in one embodiment BY will only be routed locally within the mux group to one of the other gate clusters via local routing (routing within the logic block). Hence BY could be coupled directly to F1 or H1, so that the buffered output is FY or HY. Alternatively, BY could be coupled to D0, where D1 and DS are both coupled to a logical low, and where DY is coupled to one of F1, H1, or both.

Alternatively, the multiplexers of clusters C and D can be used to form various combinational logic. For instance, to form a 2-input AND gate, C1 and CS form the AND gates two inputs, CY forms the output of the AND gate, and C0 is coupled to a logical low (e.g., "0" or gnd). In this instance, the remaining gate clusters in the logic block can be used for other functions that can be (but to not necessarily have to be) coupled to the AND gate formed with cluster C. Of course, many more functions—as well as more complicated functions—can be implemented by the logic within logic block 300. Moreover, more than one logic block 300 can be used to obtain even more options for combinational and sequential logic.

In addition to logic block 300, each function block in the array includes at least one driver block 350 in one embodiment. Driver block 350 includes gate clusters I and J. Cluster I includes driver 352 having input I1 and output IY. In addition, driver 352 includes a tri-state enable IE. Gate cluster J includes driver 354 having an input J1 and an output JY. Driver 354 does not include a tri-state enable line. The drive strength of driver 352 is twice that of driver 354. As with the inverter pairs E/G and F/H, drivers I and J can be ganged together to form an even larger drive strength. Accordingly, when ganging together, so that I1 and J1 are coupled together and IY and JY are coupled together, the combined drive strength D equals the drive strength of I plus the drive strength of J. Accordingly, J has a drive strength of 0.33D, and I (having twice as strength of J) has drive strength of 0.66D. In some embodiments D is defined as high as possible without running into electro-migration problems.

Thus, the driver block can be programmed (e.g., by routing) with three distinct drive strengths when the array is customized. Although a driver pair is described, it is to be understood that more than two drivers could be utilized for more drive strength options.

Figure 4:
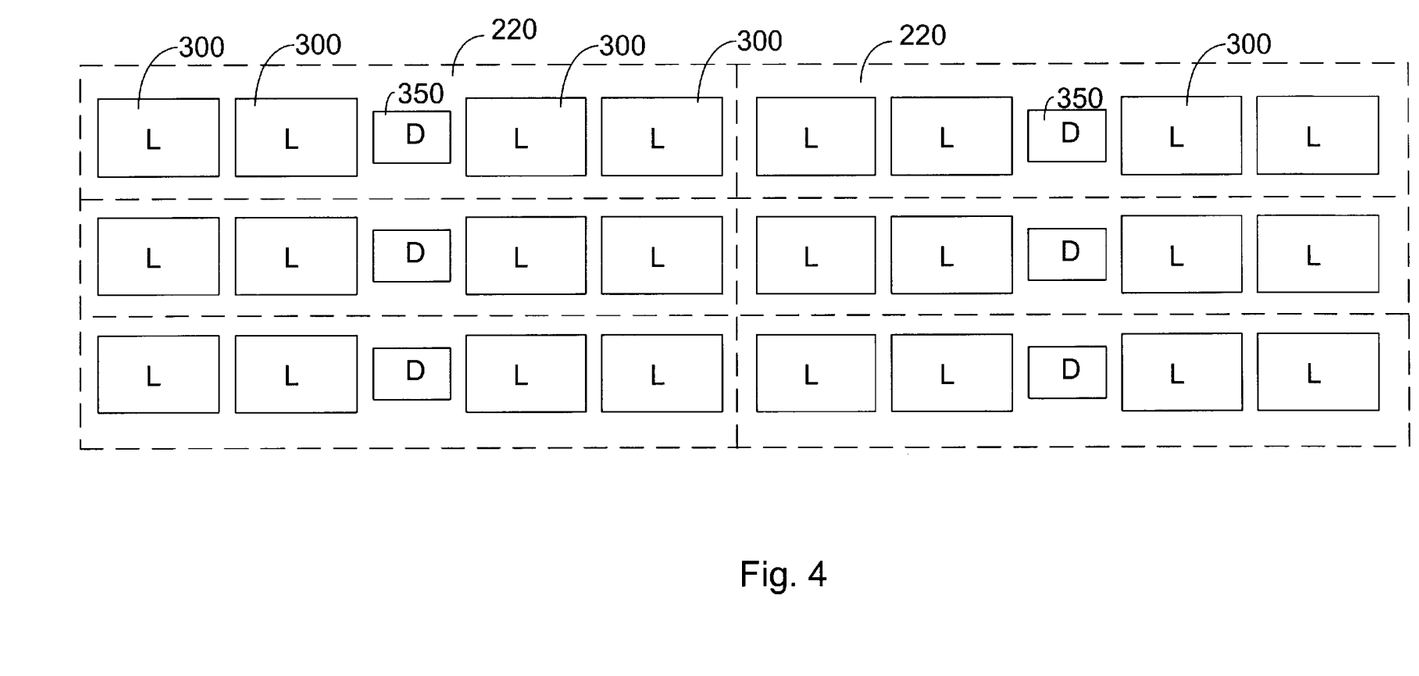
FIG. 4 is a generalized function block diagram of an arrangement of logic blocks and driver blocks within function blocks in accordance with an embodiment of the invention.
Figure 5:
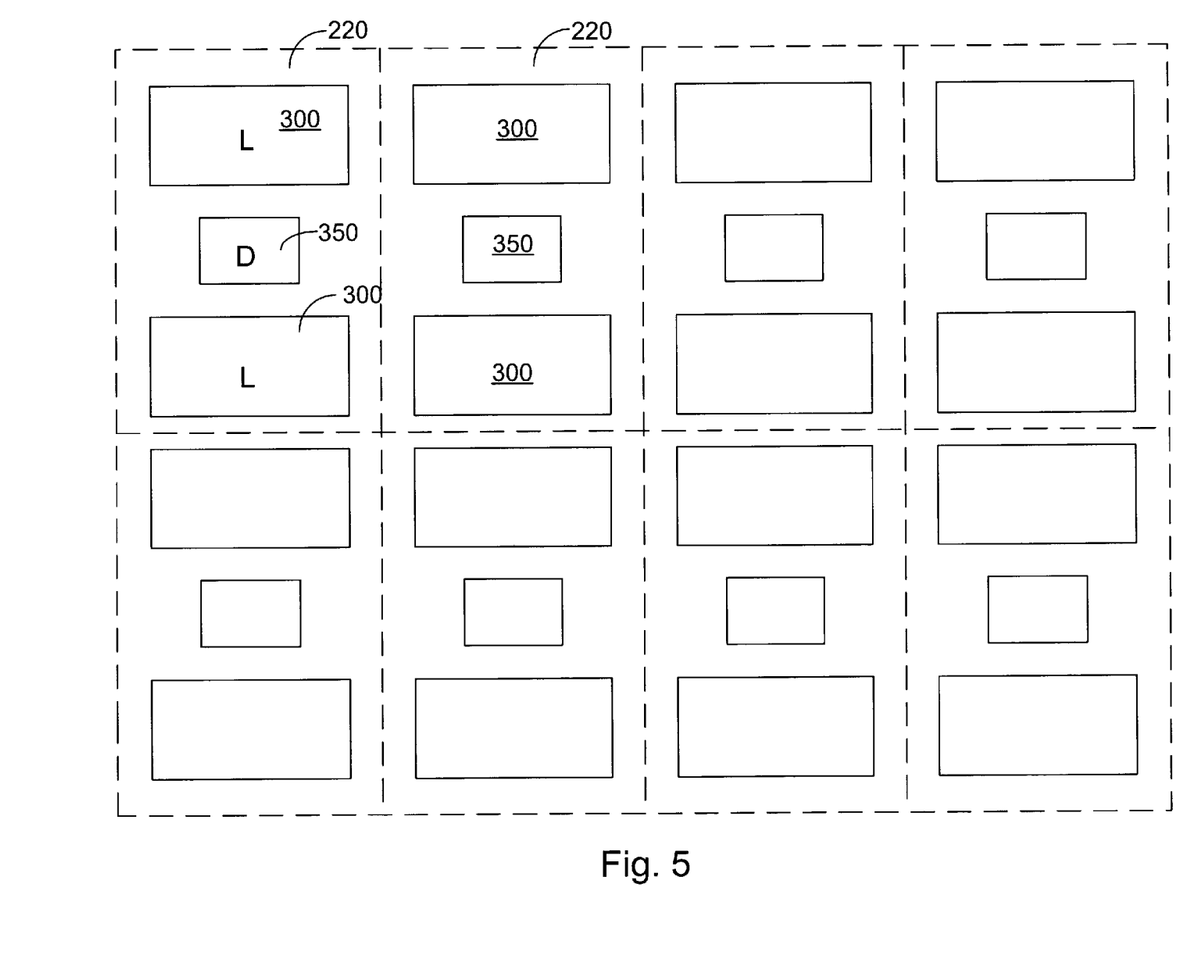
FIG. 5 is a generalized function block diagram of an arrangement of logic blocks and driver blocks within function blocks in accordance with another embodiment of the invention.

As described with respect to FIG. 3, each function block 220 includes one logic block 300 and one driver block 350. But other embodiments of the invention will include different ratios. For instance, referring to FIG. 4, a function block 220 may be defined to include four logic blocks 300 with one driver block 350. And in still other embodiments, as shown in FIG. 5, a function block may be defined to include two logic blocks 300 with one driver block 350. Still other embodiments may define a function block to include one of either a logic block 300 or a driver block 350, so that all function blocks 220 are not identical and so that the driver-block function blocks are interspersed with the logic-block function blocks at useful intervals. Moreover, some embodiments of logic block 300 may not include driving mechanisms such as clusters E–H at all, relying instead on driver blocks 350. Accordingly, the availability of drivers to logic blocks can vary from embodiment to embodiment.

Accordingly, a module architecture has been disclosed that has the ability to program drive strengths while requiring only minimal additional routing resources. The granularity of the gate clusters also allows for speed, density and flexibility in the user-defined circuits implemented with an embodiment of the invention. Still, because gates are preformed and arranged, an embodiment of the invention will require very few mask steps to customize, and in some embodiments may only require one or two such mask steps. Thus an embodiment in accordance with the invention allows for rapid, inexpensive customization. As well, the logic block 300 can implement two independent latches or could implement flip-flops or other storage elements, as well as a variety of combinational functions or a combination of combinational and sequential functions.

Although mask programming is described herein, it will be recognized by those of skill in the art that other ways of programming a user-defined circuit or selecting drive strengths exist. Accordingly, the invention is not intended to be limited to mask programming.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

What is claimed is:

1. An integrated circuit, including:
   an array of function blocks;
   wherein each function block is predesigned;
   wherein the array of function blocks are coupleable to form a user-defined circuit; and
   wherein each function block includes at least two drivers, wherein each driver has a respective drive strength;
   wherein the drivers are positioned in proximity to one another and their inputs are in selective electrical communication with one another and their outputs are in selective electrical communication with one another, resulting in a drive strength selectable from one driver, the other driver, or a combined drive strength from both drivers.

2. The integrated circuit of claim 1, wherein the driver inputs and outputs are selectively in electrical communication by selectively placing a first conductor to couple the respective inputs and a second conductor to couple the respective outputs.

3. The integrated circuit of claim 1, wherein each function block includes a logic block and a driver block, wherein the at least two drivers are included in the driver block.

4. The integrated circuit of claim 1, where the drivers are inverters.

5. The integrated circuit of claim 1, wherein each function block is capable of implementing any one of combinational logic, sequential logic, and a combination of both.

6. An integrated circuit, including:
   an array of function blocks;
   wherein each function block includes a logic block where the logic block includes a plurality of gate clusters disconnected from one another and is programmable to have any one of a first plurality of drive strengths;
   wherein each function block further includes a driver block where the driver block is programmable to have any one of a second plurality of drive strengths.

7. The integrated circuit of claim 6, wherein each function block includes a plurality of logic blocks and one driver block.

8. The integrated circuit of claim 6, wherein each function block includes four logic blocks and one driver block.

9. The integrated circuit of claim 6, wherein each function block includes two logic blocks and one driver block.

10. The integrated circuit of claim 6, wherein each driver block is programmed with mask programming to select the drive strength.

11. An integrated circuit, including:
    an array of predesigned function blocks, wherein the function blocks are coupleable to form a user-defined circuit;
    wherein each function block includes a logic block and a driver block;
    wherein the logic block includes a plurality of gate clusters disconnected from one another, the plurality of gate clusters including:

two mux-latch pairs;
two additional multiplexers; and
two driver pairs;
wherein the driver pairs can each be programmed to have any one of a plurality of drive strengths;
wherein the driver block includes an additional driver pair that can be programmed to have any one of a second plurality of drive strengths.

12. An integrated circuit, including:

an array of predesigned function blocks, wherein the function blocks are coupleable to form a user-defined circuit;

wherein each function block includes four logic blocks and a driver block;

wherein each logic block includes a plurality of gate clusters disconnected from one another, the plurality of gate clusters including:

a driver group, including a plurality of drivers;

wherein the driver group can be programmed to have any one of a plurality of drive strengths;

wherein the driver block includes a second driver group, including a second plurality of drivers, that can be programmed to have any one of a second plurality of drive strengths.

13. An integrated circuit, including:

an array of predesigned function blocks, wherein the function blocks are coupleable to form a user-defined circuit;

wherein each function block includes two logic blocks and a driver block;

wherein each logic block includes a plurality of gate clusters disconnected from one another, the plurality of gate clusters including:

a driver group, including a plurality of drivers;

wherein the driver group can be programmed to have any one of a plurality of drive strengths;

wherein the driver block includes a second driver group, including a second plurality of drivers, that can be programmed to have any one of a second plurality of drive strengths.

14. An integrated circuit, including:

an array of predesigned function blocks, wherein the function blocks are coupleable to form a user-defined circuit and wherein the function blocks are disconnected from one another prior to forming the user-defined circuit;

wherein a first plurality of function blocks in the array each includes a logic block;

wherein a second plurality of function blocks in the array each includes a driver block;

wherein the second plurality of function blocks is not identical to the first plurality of function blocks;

wherein the driver block is programmable to have any one of a plurality of drive strengths.

15. The integrated circuit of claim 14, wherein the logic block is programmable to have any one of a plurality of drive strengths.

16. The integrated circuit of claim 14, wherein the driver block is programmed with mask programming.

17. The integrated circuit of claim 14, wherein the first plurality of function blocks is the same as the second plurality.

18. The integrated circuit of claim 14, wherein the first plurality of function blocks is different from the second plurality.

* * * * *